United States Patent
Yamanaka et al.

(10) Patent No.: US 9,897,286 B2
(45) Date of Patent: Feb. 20, 2018

(54) PHOSPHOR OPTICAL ELEMENT AND LIGHT-EMITTING DEVICE USING THE SAME

(71) Applicant: Panasonic Intellectual Property Management Co., Ltd., Osaka (JP)

(72) Inventors: Kazuhiko Yamanaka, Osaka (JP); Norio Ikedo, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/435,762

(22) Filed: Feb. 17, 2017

(65) Prior Publication Data

US 2017/0159911 A1    Jun. 8, 2017

Related U.S. Application Data

(63) Continuation of application No. 14/173,773, filed on Feb. 5, 2014, now Pat. No. 9,605,832, which is a
(Continued)

(30) Foreign Application Priority Data

Aug. 15, 2011  (JP) .................................. 2011-177772

(51) Int. Cl.
   *F21V 9/08*     (2006.01)
   *F21V 9/16*     (2006.01)
   (Continued)

(52) U.S. Cl.
   CPC .............. *F21V 9/16* (2013.01); *C09K 11/025* (2013.01); *F21V 5/04* (2013.01); *F21V 7/0066* (2013.01);
   (Continued)

(58) Field of Classification Search
   CPC ............ F21V 5/04; F21V 9/16; F21V 7/0066; H05B 33/10; C09K 11/025
   See application file for complete search history.

(56) References Cited

U.S. PATENT DOCUMENTS

2006/0268537 A1   11/2006   Kurihara et al.
2007/0221867 A1    9/2007   Beeson et al.
(Continued)

FOREIGN PATENT DOCUMENTS

CN       1577902 A     2/2005
CN     101570689 A    11/2009
(Continued)

OTHER PUBLICATIONS

International Search Report issued in International Application No. PCT/JP2012/001661 dated Jun. 5, 2012, with English Translation.
(Continued)

*Primary Examiner* — Anabel Ton
(74) *Attorney, Agent, or Firm* — McDermott Will & Emery LLP

(57) ABSTRACT

A phosphor optical element includes: a base member; a phosphor-containing member that includes a transparent member containing a phosphor particle; and a cover member, wherein the base member, the phosphor-containing member, and the cover member are sequentially formed on a transparent base that is transparent to a wavelength of incident light from an excitation light source, the phosphor particle has a diameter no greater than the wavelength of the incident light, and in an arbitrary cross section of the phosphor-containing member in a direction perpendicular to a main surface of the transparent base, the phosphor-containing member has, in a direction perpendicular to the main surface of the transparent base, a thickness no greater than the wavelength of the incident light.

12 Claims, 13 Drawing Sheets

Related U.S. Application Data continuation of application No. PCT/JP2012/001661, filed on Mar. 9, 2012.

(51) Int. Cl.
    *H05B 33/10*     (2006.01)
    *F21V 5/04*     (2006.01)
    *F21V 7/00*     (2006.01)
    *C09K 11/02*     (2006.01)
    *H01L 33/50*     (2010.01)
    *F21Y 115/30*     (2016.01)

(52) U.S. Cl.
    CPC .............. *H05B 33/10* (2013.01); *C09K 11/02* (2013.01); *F21Y 2115/30* (2016.08); *H01L 33/505* (2013.01); *H01L 33/507* (2013.01); *H01L 2224/16225* (2013.01)

(56) References Cited

U.S. PATENT DOCUMENTS

| | | | |
|---|---|---|---|
| 2008/0258160 A1 | 10/2008 | Do | |
| 2009/0147497 A1 | 6/2009 | Nada | |
| 2010/0123386 A1 | 5/2010 | Chen | |
| 2011/0215355 A1 | 9/2011 | van de Ven et al. | |
| 2013/0279151 A1 | 10/2013 | Ouderkirk et al. | |
| 2014/0153216 A1* | 6/2014 | Yamanaka | F21V 9/16 |
| | | | 362/84 |

FOREIGN PATENT DOCUMENTS

| | | |
|---|---|---|
| CN | 102142502 A | 8/2011 |
| JP | 2006-186022 A | 7/2006 |
| JP | 2007-005098 A | 1/2007 |
| JP | 2009-063386 A | 3/2009 |
| JP | 2010-198805 A | 9/2010 |

OTHER PUBLICATIONS

Chinese Office Action dated Feb. 15, 2015, Issued in corresponding Chinese Patent Application No. 201280039237.X, (w/ English translation).

Chinese Office Action and Search Report issued in corresponding Chinese Patent Application No. 2012800039237.X, dated Mar. 31, 2016; with English translation.

\* cited by examiner

FIG. 2

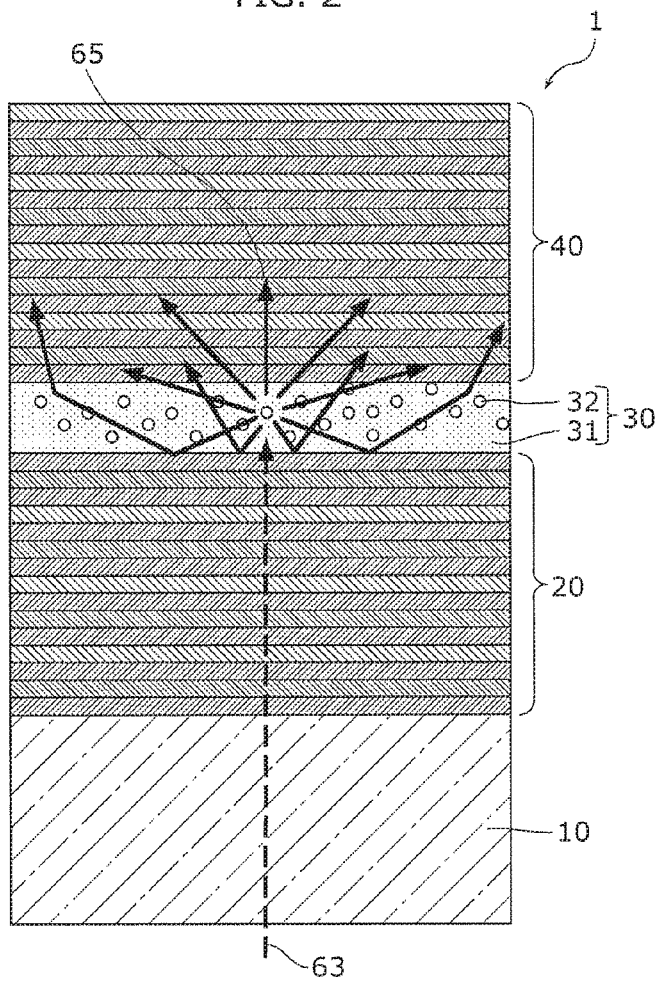

FIG. 3A

|  |  |  | Refractive index | Film thickness (μm) | Number of layers |
|---|---|---|---|---|---|
| Base member 20 | First base layer 21 | First refractive index layer 21a | 2.0 | 0.036 | 11 |
|  |  | Second refractive index layer 21b | 2.4 | 0.031 |  |
|  |  | First refractive index layer 21a | 2.0 | 0.036 |  |
|  | Second base layer 22 |  | 1.5 | 0.031 |  |
| Phosphor-containing member 30 |  |  | 1.5 | 0.100 | 1 |
| Cover member 40 | First cover layer 41 | Third refractive index layer 41a | 2.0 | 0.095 | 11 |
|  |  | Fourth refractive index layer 41b | 2.4 | 0.058 |  |
|  |  | Third refractive index layer 41a | 2.0 | 0.095 |  |
|  | Second cover layer 42 |  | 1.5 | 0.058 |  |

| Item | Value |
|---|---|
| Refractive index of transparent member 135 | 2.0 |
| Refractive index of phosphor-containing member 133 | 1.4 |
| Pitch P of transparent member 135 | 195 nm |
| Diameter D of transparent member 135 | 120 nm |
| Propagation distance L of fluorescent light 165 | 2.7 μm |

PHOSPHOR OPTICAL ELEMENT AND LIGHT-EMITTING DEVICE USING THE SAME

CROSS REFERENCE TO RELATED APPLICATION

This is a continuation of U.S. patent application Ser. No. 14/173,773 filed on Feb. 5, 2014, now U.S. Pat. No. 9,605,832, which is a continuation application of PCT International Application No. PCT/JP2012/001661 filed on Mar. 9, 2012, designating the United States of America, which is based on and claims priority of Japanese Patent Application No. 2011-177772 filed on Aug. 15, 2011. The entire disclosures of the above-identified applications, including the specifications, drawings and claims are incorporated herein by reference in their entirety.

FIELD

The present disclosure relates to phosphor optical elements and light-emitting devices using the phosphor optical elements, and particularly to a phosphor optical element in a light-emitting device which is used as a light source of a projector or a light source of a backlight of a liquid crystal display device.

BACKGROUND

Recent years have seen rapid growth in a market of display devices, such as a thin-type television and a projector. These display devices include liquid crystal panels. A light-emitting device which emits white light is provided as a white light source device at the back of the liquid crystal panel. The liquid crystal panel is used as a light modulation element of transmission-type, and forms an image by controlling the transmittance of light irradiated from the light-emitting device. Conventionally, as these light-emitting devices, a cold cathode fluorescent lamp (CCFL) or a super-high pressure mercury (UHP: ultra high performance) lamp has been used. However, with intent to conserve energy and reduce the use of mercury in consideration of environment, as such a light source, recent years have seen development of a light-emitting device in which a semiconductor light-emitting element, such as a light emitting diode (LED), in combination with a phosphor optical element that obtains fluorescent light by converting with phosphor the light from the semiconductor light-emitting element.

There are light-emitting device of (i) a phosphor integral-type in which a semiconductor light-emitting element and a phosphor optical element are disposed on the same package and (ii) a phosphor separation-type in which a semiconductor light-emitting element and a phosphor optical element are disposed at separate locations within a display device.

In both types of the light-emitting device, in the phosphor optical element, fluorescent light from phosphors is emitted omnidirectionally. Thus, there are needs of optical systems which efficiently collect fluorescent light or improving directivity of fluorescent light.

Conventionally, there is a technique for improving efficiency in utilizing fluorescent light. For example, patent literature (PTL) 1 discloses a technique in which a dichroic mirror is disposed between an LED element and resin which includes phosphors to reflect, among the omnidirectionally emitted fluorescent light, the light that travels toward an LED element. The following describes a conventional light-emitting device 1000 using FIG. 14.

As shown in FIG. 14, the conventional light-emitting device 1000 includes: a recessed case 1004 including an opening 1042; an LED element 1002 which is a light source for exciting phosphors and is mounted on an element mounting surface 1040 that is a base of the recess of the case 1004; and a dichroic mirror 1003 provided above the LED element 1002. Furthermore, above the LED element 1002, a phosphor-containing silicone resin 1008 that is a silicone resin including rare-earth activated phosphors, such as YAG: Ce or the like having a particle diameter of 10 to 20 μm, is formed via a silicone resin 1007. The side surface of the recess of the case 1004 (i) is a tilted face 1041 that is formed obliquely with respect to a light-emitting direction of the LED element 1002, and (ii) has a function of reflecting, toward the front direction of the light-emitting device 1000, the fluorescent light emitted from the phosphor-containing silicone resin 1008 together with the light emitted from the LED element 1002.

In the light-emitting device 1000 having the above-described configuration, the light emitted from the LED element 1002 passes through the silicone resin 1007 and enters the phosphor-containing silicone resin 1008. A portion of the light which entered the phosphor-containing silicone resin 1008 is reflected, and another portion of the light is absorbed by the phosphors to be emitted as fluorescent light. The fluorescent light from the phosphor-containing silicone resin 1008 is omnidirectionally emitted, and due to multiple reflections by the tilted face 1041, a dichroic mirror 1003, and the like, and is emitted to outside of the light-emitting device 1000 through the entire surface of the opening 1042.

Furthermore, PTL 2 discloses a light-emitting device that uses, as a light source of a projector, fluorescent light obtained by causing light from an excitation light source to incident on a phosphor light emitting element in which a dichroic mirror and a phosphor are used in combination.

CITATION LIST

Patent Literature

[PTL 1]
Japanese Unexamined Patent Application Publication No. 2006-186022

[PTL 2]
Japanese Unexamined Patent Application Publication No. 2010-198805

SUMMARY

Technical Problem

However it is difficult for a conventional phosphor optical element to efficiently emit the obtained fluorescent light in a predetermined direction with a desired light-emitting area, which is problematic. More specifically, it is possible to emit the fluorescent light in a predetermined direction, by using a member containing a phosphor (a phosphor-containing member) and the dichroic mirror in combination. However, the fluorescent light can freely propagate in the planar direction of a layer of the phosphor-containing member. This causes the fluorescent light to be emitted from the entire surface of the phosphor-containing member and increases the light-emitting area of the fluorescent light, which is problematic. In this case, when the fluorescent light emitted from the phosphor optical element is converted into parallel light using a lens or the like, an oblique light component increases, which results in a loss for an optical system at a subsequent stage. Consequently, the efficiency of the optical system decreases. In view of such a problem, for example, it is possible to reduce an area of the phosphor-containing member. However, in this case, the phosphor-containing member and the light-emitting element need to be aligned with higher accuracy, which leads to an increase in the cost of the phosphor optical element.

The present disclosure is conceived to solve the above-described problem, and one non-limiting and exemplary embodiment provides a phosphor optical element and a light-emitting device which can easily reduce the light-emitting area of fluorescent light without reducing the area of a phosphor-containing member.

Solution to Problem

In view of the above-described problem, in one general aspect, the techniques disclosed here feature a phosphor optical element including: a base member; a phosphor-containing member that includes a transparent member containing a phosphor particle; and a cover member, wherein the base member, the phosphor-containing member, and the cover member are sequentially formed on a transparent base that is transparent to a wavelength of incident light emitted from an excitation light source, the phosphor particle has a diameter no greater than the wavelength of the incident light, and in an arbitrary cross section of the phosphor-containing member in a direction perpendicular to a main surface of the transparent base, the phosphor-containing member has, in at least one of (i) a direction perpendicular to and (ii) a direction horizontal to the main surface of the transparent base, a thickness no greater than the wavelength of the incident light.

With this configuration, it is possible to reduce a chance for a portion of the fluorescent light generated by the phosphor particle to propagate in a direction parallel to the main surface of the transparent base. Thus, the light-emitting area of the fluorescent light can be approximately the same as an area on which incident light emitted from the excitation light source incidents.

Furthermore, in the aspect of the phosphor optical element according to the present disclosure, it may be that at least one of the base member and the cover member includes a multilayer film whose layers are stacked in a direction perpendicular to the transparent base. In this case, for example, the multilayer film is a dielectric multilayer film.

With this configuration, it is possible to reduce a chance for a portion of the fluorescent light generated by the phosphor particle to propagate in a direction parallel to the main surface of the transparent base, and guide the florescent light in a predetermined emission direction.

Furthermore, in the aspect of the phosphor optical element according to the present disclosure, for example, the base member transmits the incident light and reflects fluorescent light emitted from the phosphor-containing member.

With this configuration, it is possible to reduce a chance for a portion of the fluorescent light generated by the phosphor particle to propagate in a direction parallel to the main surface of the transparent base, and guide the florescent light in a predetermined emission direction.

Furthermore, in the aspect of the phosphor optical element according to the present disclosure, it may be that the phosphor-containing member has, in a two dimensional planar direction that is a direction parallel to the main surface of the transparent base, a refractive index distribution according to a two-dimensional periodic structure. In this case, the two-dimensional periodic structure may include a photonic crystal.

With this configuration, it is possible to reduce a chance for a portion of the fluorescent light generated by the phosphor particle to propagate in a direction parallel to the main surface of the transparent base, and guide the florescent light in a predetermined emission direction.

Furthermore, in the aspect of the phosphor optical element according to the present disclosure, it may be that the phosphor-containing member includes two types of transparent materials having different refractive indices, and the phosphor particle is included in at least one of the two types of transparent materials having different refractive indices.

With this configuration, it is possible to reduce a chance for a portion of the fluorescent light generated by the phosphor particle to propagate in a direction parallel to the main surface of the transparent base, and guide the florescent light in a predetermined emission direction.

Furthermore, in the aspect of the phosphor optical element according to the present disclosure, at least one of the two types of transparent materials having different refractive indices may include ZnO.

With this configuration, a phosphor-containing optical element can be easily configured which can reduce a chance for a portion of the fluorescent light generated by the phosphor particle to propagate in a direction parallel to the main surface of the transparent base, and guide the florescent light in a predetermined emission direction.

Furthermore, in the aspect of the phosphor optical element according to the present disclosure, a topmost layer of the base member may be a ZnO film.

With this configuration, a phosphor-containing optical element can be easily configured which can reduce a chance for a portion of the fluorescent light generated by the phosphor particle to propagate in a direction parallel to the main surface of the transparent base, and guide the florescent light in a predetermined emission direction.

Furthermore, in one general aspect, the techniques disclosed here feature a light-emitting device including: the phosphor optical element described above; and a light-emitting element that is an excitation light source, wherein the light-emitting element has an optical axis perpendicular to a surface of the transparent base of the phosphor optical element.

With this configuration, the wavelength of the light emitted from a light-emitting element can be easily converted with a simple configuration, and the propagation direction of light can be controlled.

Additional benefits and advantages of the disclosed embodiments will be apparent from the Specification and Drawings. The benefits and/or advantages may be individually obtained by the various embodiments and features of the Description and Drawings, which need not all be provided in order to obtain one or more of such benefits and/or advantages.

Advantageous Effects

The present disclosure makes it possible to easily reduce a light-emitting area of fluorescent light without decreasing an area of a phosphor-containing member. With this, the traveling direction of light can be freely controlled with an optical system or the like which is provided in a subsequent stage.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 is a diagram for describing operations of the phosphor optical element according to Embodiment 1.

FIG. 3A is a diagram showing calculation parameters for describing functions of the phosphor optical element according to Embodiment 1.

DESCRIPTION OF EMBODIMENTS

Figure 1:
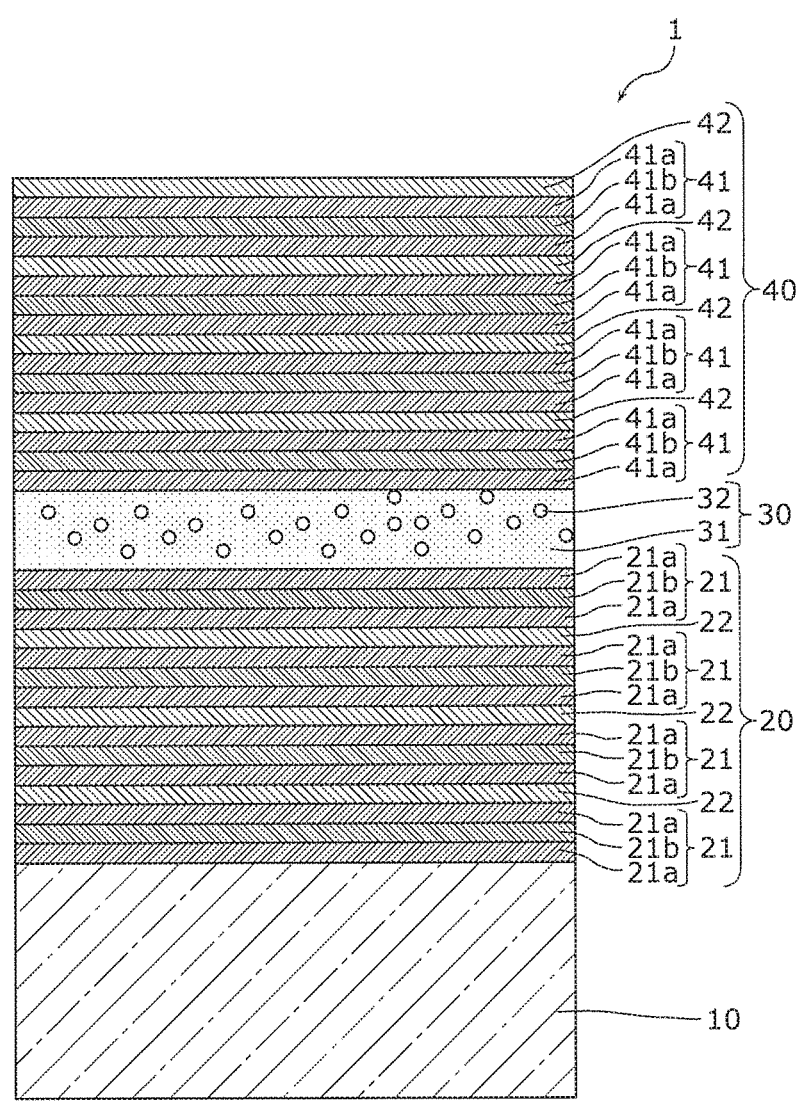
FIG. 1 is a cross-sectional view showing a configuration of a phosphor optical element according to Embodiment 1.

Hereinafter, certain exemplary embodiments are described in greater detail with reference to the accompanying Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the present disclosure. The present disclosure is defined by Claims. Therefore, among the structural elements in the following exemplary embodiments, structural elements not recited in any one of the independent claims defining the most generic part of the inventive concept are not necessarily required to solve the problem of the present disclosure, but are described as structural elements of a more preferable form. Furthermore, elements having substantially the same configurations, operations, and effects are denoted with the same reference signs in the drawings.

Embodiment 1

The following describes a phosphor optical element and a light-emitting device according to Embodiment 1 of the present disclosure. First, the phosphor optical element according to Embodiment 1 of the present disclosure is described using FIG. 1. FIG. 1 is a cross-sectional view showing a configuration of the phosphor optical element according to this embodiment.

As shown in FIG. 1, a phosphor optical element 1 according to this embodiment is a light-emitting element which emits fluorescent light with incident light from an excitation light source, and includes: a transparent base 10; and a stacked structure including, a base member 20, a phosphor-containing member 30, and a cover member 40 which are formed sequentially on the transparent base 10.

The transparent base 10 includes a material transparent to a wavelength of an incident light from the excitation light source. For example, the transparent base 10 may be a transparent board made of glass, a transparent resin film, or the like.

The base member 20 is a dielectric multilayer film that includes: a first base layer 21 (a first layer) having, for example, a structure in which a second refractive index layer 21b including $TiO_2$ is between first refractive index layers 21a including ZnO; and a second base layer 22 (a second layer) including, for example, $SiO_2$. The layers are stacked in a direction perpendicular to a main surface (the surface) of the transparent base 10. The base member 20 includes the first base layer 21 and the second base layer 22 that are alternately stacked, and is a multilayer film in which, for example, five or more layers made up of the first base layers 21 and the second base layers 22 are stacked. The base member 20 in this embodiment includes seven layers, that is, four layers of the first base layer 21 and three layers of the second base layer 22. Note that, each of the bottommost layer and the topmost layer of the base member 20 is the first base layer 21 that is a ZnO film.

Furthermore, the base member 20 is transparent to a wavelength of an incident light (excitation light) from the excitation light source, and acts as a mirror to a wavelength of the fluorescent light emitted from the phosphor-containing member 30. More specifically, the base member 20 functions as a first dichroic mirror which transmits the excitation light and reflects the fluorescent light from the phosphor-containing member 30.

The phosphor-containing member 30 is a phosphor-containing layer stacked on the base member 20, and includes: a transparent member 31 including a transparent material; and phosphor particles 32 which are included in the transparent member 31 and emit fluorescent light with incident light (excitation light) from the excitation light source. As each of the phosphor particles 32, for example, a semiconductor particle having a particle diameter of 100 nm or less, such as an InP/ZnS core shell quantum dot phosphor, can be used. With the quantum dot phosphor, even in the case of particles of an identical material, the fluorescent light spectrum of a desired wavelength range in a visible light range can be obtained by controlling the diameter of a particle because of a quantum size effect. Furthermore, as the transparent member 31, a transparent resin material, such as a silicone resin having a refractive index of 1.4 can be used, for example.

The cover member 40 is formed on the phosphor-containing member 30, and is a dielectric multilayer film that includes: a first cover layer 41 (a third layer) in which, for example, a fourth refractive index layer 41b including $TiO_2$ is between third refractive index layers 41a including ZnO; and a second cover layer 42 (a fourth layer) including, for example, $SiO_2$. The layers are alternately stacked in a direction perpendicular to the main surface of the transparent base 10. The cover member 40 includes the first cover layer 41 and the second cover layer 42 that are alternately stacked, and is a multilayer film in which, for example, five or more layers made up of the first cover layers 41 and the second cover layers are stacked. The cover member 40 in this embodiment includes eight layers, that is, four layers of the first cover layer 41 and four layers of the second cover layer 42.

Furthermore, in contrast to the base member 20, the cover member 40 acts as a mirror to a wavelength of the incident light (excitation light) from the excitation light source, and is transparent to a wavelength of the fluorescent light emitted from the phosphor-containing member 30. More specifically, the cover member 40 functions as a second dichroic mirror which reflects the excitation light and transmits the fluorescent light from the phosphor-containing member 30.

In the phosphor optical element 1 having the above-described configuration, the diameter of the phosphor particle 32 in the phosphor-containing member 30 is configured to be no greater than a wavelength of the incident light from the excitation light source. Furthermore, in the arbitrary cross section of the phosphor-containing member 30 in the direction perpendicular to the main surface of the transparent base 10, the thickness of the phosphor-containing member 30 in the direction perpendicular to the main surface of the transparent base 10 (stacking direction), that is, the film thickness of the phosphor-containing member 30 is also configured to be no greater than a wavelength of the incident light from the excitation light source.

With this configuration, for example, the phosphor particles 32 in the phosphor-containing member 30 perform long wavelength conversion on the excitation light (incident light) having a wavelength of 405 nm and emit, for example, fluorescent light having a peak wavelength of 540 nm, and a full width at half maximum of 50 nm of the spectrum. In this case, the thickness of the phosphor-containing member 30 in the above-described cross-section is set to be no greater than the wavelength of the excitation light, that is, no greater than 405 nm. More specifically, the thickness of the phosphor-containing member 30 in the above-described cross-section is set to, for example, approximately no greater than 390 nm that is the resulting wavelength by dividing the peak wavelength (540 nm) of fluorescent light by the refractive index (1.4) of the transparent member 31.

Next, operations of the phosphor optical element 1 having the above-described configuration are described using FIG. 2. FIG. 2 is a diagram for describing operations of a phosphor optical element according to this embodiment.

As shown in FIG. 2, incident light 63 which is from the excitation light source and enters from the transparent base 10 side passes through the transparent base 10 and the base member 20, and enters the phosphor-containing member 30. A portion of the incident light 63 which entered the phosphor-containing member 30 is converted into the fluorescent light 65 and emitted by the phosphor particles 32. On the other hand, another portion of the incident light 63 not absorbed by the phosphor particles 32 passes through the phosphor-containing member 30. The incident light 63 which passed through the phosphor-containing member 30 is reflected by the cover member 40, and enters the phosphor-containing member 30 again. The light which entered the phosphor-containing member 30 again is converted into the fluorescent light 65 by the phosphor particles 32. In this manner, the light which passed through the phosphor-containing member 30 is reflected by the cover member 40, and enters the phosphor-containing member 30 again. Thus, the incident light 63 can be efficiently converted into the fluorescent light 65.

The fluorescent light 65 generated in the phosphor-containing member 30 is omnidirectionally emitted. Among this, the fluorescent light 65 which entered the cover member 40 passes through the cover member 40, and is emitted in a predetermined emission direction. On the other hand, the fluorescent light 65 which travels toward the base member 20 is reflected by the base member 20, passes through the phosphor-containing member 30 and the cover member 40, and is emitted in a predetermined emission direction.

In this case, in the phosphor optical element 1 according to this embodiment, as described above, the phosphor-containing member 30 is configured to have a film thickness no greater than the wavelength of the incident light 63 (excitation light). Thus, the film thickness of the phosphor-containing member 30 is thin enough with respect to the fluorescent light 65. With this, the fluorescent light 65 scarcely propagates in a planar direction of the phosphor-containing member 30 that is a two dimensional direction parallel to the main surface of the transparent base 10 (a direction perpendicular to the stacking direction). Thus, the light-emitting area of the fluorescent light 65 can be about the same size as the area on which the incident light 63 (excitation light) incidents, which makes it possible to easily reduce the light-emitting area of the fluorescent light 65 without reducing the area of the phosphor-containing member 30. As a result, the traveling direction of light can be freely controlled using an optical system or the like disposed in a stage subsequent to the phosphor optical element 1.

Figure 3B:
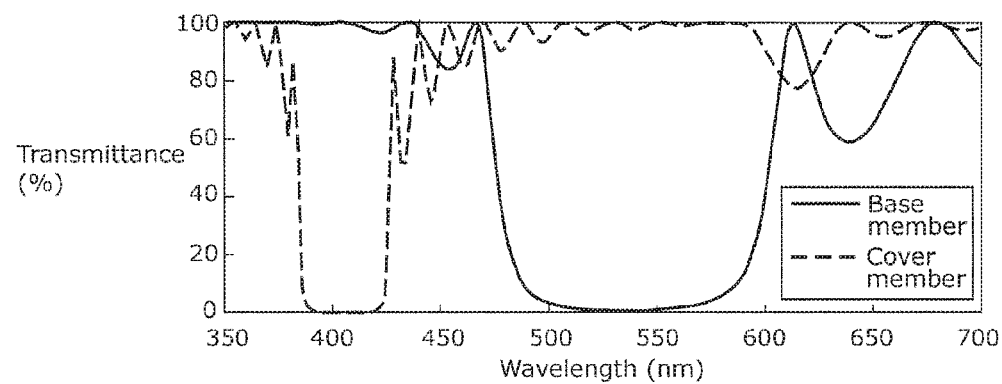
FIG. 3B is a diagram showing transmittance of a base member and a cover member in the phosphor optical element according to Embodiment 1, which is obtained based on the calculation parameters in FIG. 3A.
Figure 3C:
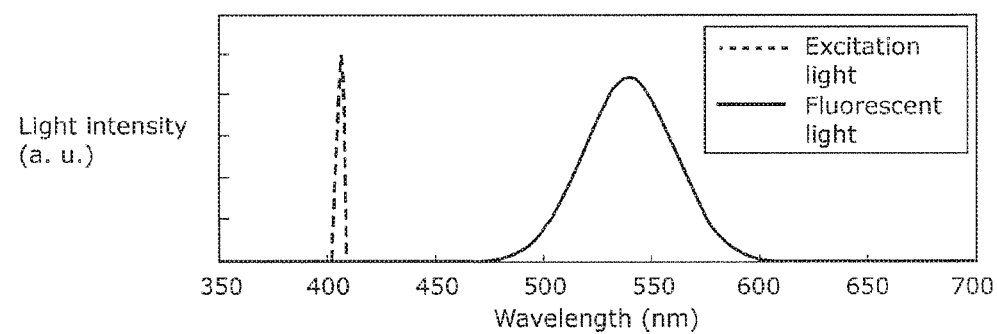
FIG. 3C is a diagram showing light intensity of excitation light and fluorescent light in the phosphor optical element according to Embodiment 1.

Next, operations of the phosphor optical element 1 according to this embodiment in FIG. 2 are described based on the calculation results of FIG. 3A, FIG. 3B, and FIG. 3C. FIG. 3A is a diagram showing calculation parameters for describing functions of a phosphor optical element according to this embodiment. FIG. 3B is a diagram showing transmittance of a base member and a cover member in the phosphor optical element according to this embodiment, which is obtained using the calculation parameters in FIG. 3A. FIG. 3C is a diagram showing light intensity of excitation light and fluorescent light in the phosphor optical element according to this embodiment.

Here, as shown in FIG. 3C, the wavelength of the excitation light (the incident light 63) is 405 nm, and the excitation light in this embodiment is laser light. The fluorescent light 65 has a peak wavelength of 540 nm, and is light from the phosphor particles 32 which include quantum dot phosphors.

As shown in FIG. 3B, according to the transmittance of the base member 20 and the cover member 40 obtained using the calculation parameters in FIG. 3A, the base member 20 transmits the incident light 63 having a wavelength of 405 nm, while reflecting most of the fluorescent light 65 having a central wavelength of 540 nm. Furthermore, it is indicated that the cover member 40 reflects the incident light 63 having a wavelength of 405 nm, while transmitting the fluorescent light 65 having a central wavelength of 540 nm.

In this manner, in this embodiment, the phosphor-containing member 30 is between the dichroic mirrors of the base member 20 and the cover member 40. Thus, as described in FIG. 2, the incident light 63 passes through the base member 20 and is reflected by the cover member 40. This makes it possible to efficiently generate the fluorescent light 65 in the phosphor-containing member 30. Furthermore, the fluorescent light 65 generated in the phosphor-containing member 30 passes through the cover member 40, and is reflected by the base member 20. Thus, the obtained fluorescent light 65 can be efficiently emitted to the outside of the phosphor optical element 1. Furthermore, in this embodiment, the phosphor-containing member 30 is configured to have a thickness no greater than a wavelength of the incident light 63 (excitation light). Thus, the fluorescent light 65 scarcely propagates in a planar direction of the phosphor-containing member 30. Thus, the light-emitting area of the fluorescent light 65 can be reduced without reducing the area of the phosphor-containing member 30.

Figure 4:
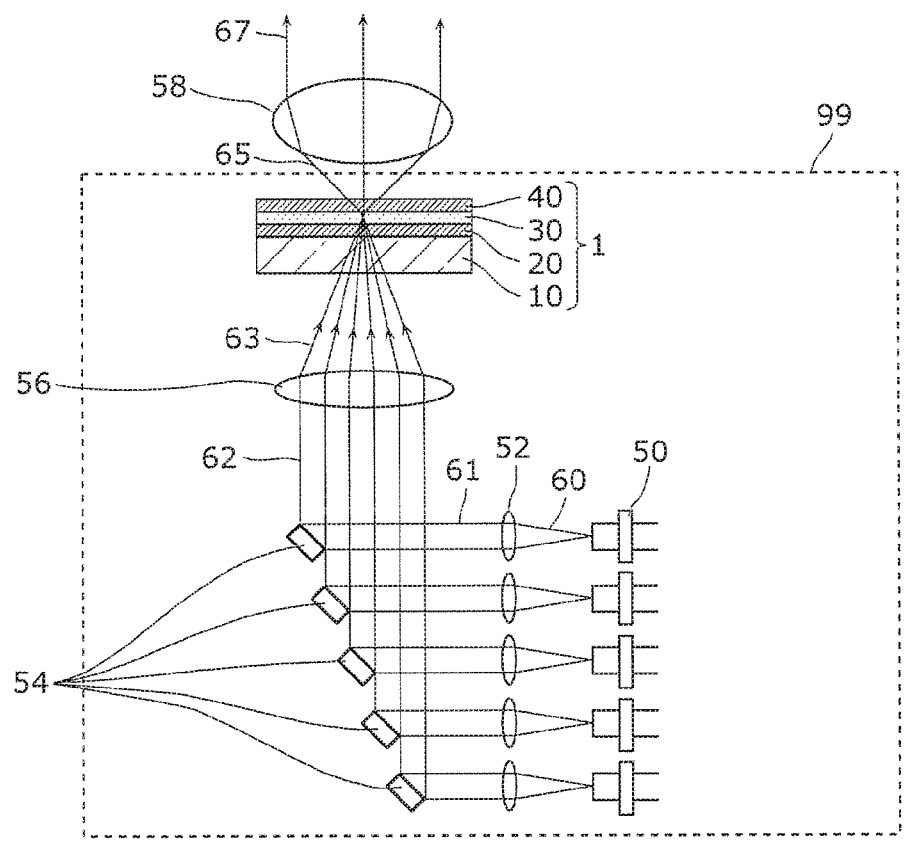
FIG. 4 is a diagram for describing a configuration and operations of a light-emitting device using the phosphor optical element according to Embodiment 1.

Next, a configuration and operations of a light-emitting device 99 using a phosphor optical element 1 shown in FIG. 1 is described using FIG. 4. FIG. 4 is a diagram for describing a configuration and operations of a light-emitting device using the phosphor optical element according to this embodiment.

As shown in FIG. 4, the light-emitting device 99 according to this embodiment includes: the phosphor optical element 1; and a light-emitting element 50 that is an excitation light source including a plurality of semiconductor lasers (semiconductor light-emitting elements). The optical axis of the light-emitting element 50 is perpendicular to the surface of the transparent base 10 in the phosphor optical element 1. Furthermore, the light-emitting device 99 includes: a plurality of collimating lenses 52 arranged at light emitting positions of a plurality of the light-emitting elements 50; a plurality of reflecting mirrors 54 arranged in front (light traveling direction) of the collimating lenses 52, corresponding to the collimating lenses 52; and a collecting lens 56 disposed in the light path of reflected light from the reflecting mirrors 54 to collect all the light reflected by the reflecting mirrors 54. The phosphor optical element 1 is disposed with the phosphor-containing member 30 of the phosphor optical element 1 aligned at a light-converging position of the collecting lens 56. In other words, the phosphor-containing member 30 of the phosphor optical element 1 is disposed at the focal point of the collecting lens 56. Note that, on a light emission side of the phosphor optical element 1, a collimating lens 58 is disposed at a position facing the phosphor optical element 1.

Subsequently, operations of the light-emitting device 99 are described. First, emitted light 60 (excitation light) emitted from the light-emitting elements 50 becomes parallel light 61 with the corresponding collimating lenses 52, and then becomes parallel light 62 having light propagation area which has been shaped with the reflecting mirrors 54. The parallel light 62 becomes converged light by the collecting lens 56, and enters the phosphor optical element 1 as the incident light 63 and converges at the phosphor-containing member 30. In the phosphor-containing member 30, the incident light 63 is converted into the fluorescent light 65 with the semiconductor particles, and emitted from the phosphor optical element 1. The fluorescent light 65 emitted from the phosphor optical element 1 is converted into parallel light 67 by the collimating lens 58.

With the light-emitting device 99 according to this embodiment, the light emitted from the phosphor optical element 1 can be easily converted into parallel light by the collimating lens 58, because the light-emitting area of the fluorescent light 65 can be reduced with the phosphor optical element 1. In this manner, with the light-emitting device 99, the light-emitting area of the fluorescent light 65 generated by the phosphor optical element 1 can be reduced. Thus, the traveling direction of light can be freely controlled with the optical system or the like that is disposed in the stage subsequent to the phosphor optical element 1.

Figure 5:
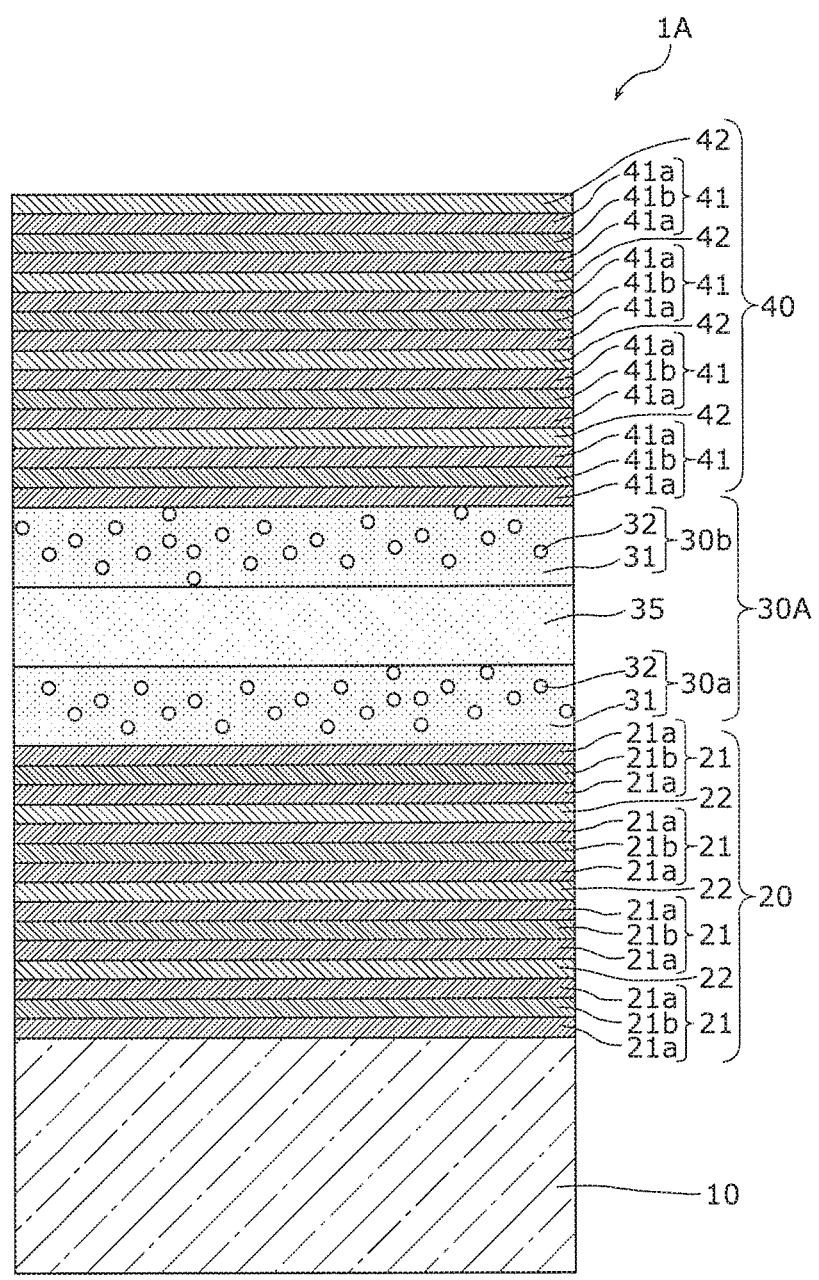
FIG. 5 is a cross-sectional view showing a configuration of a phosphor optical element according to a modification of Embodiment 1.

Next, a phosphor optical element 1A according to a modification of Embodiment 1 of the present disclosure is described using FIG. 5. FIG. 5 is a cross-sectional view showing a configuration of a phosphor optical element according to the modification of this embodiment. Note that, the configuration of the phosphor optical element 1A according to this modification is substantially the same as the configuration of the phosphor optical element 1 according to Embodiment 1. Thus, this modification mainly describes portions different from Embodiment 1. Note that, in FIG. 5, the same structural elements as those in FIG. 1 are denoted with the same reference signs.

Compared to the phosphor optical element 1 according to Embodiment 1 shown in FIG. 1, the phosphor optical element 1A according to this modification is different in a configuration of a phosphor-containing member as shown in FIG. 5. A phosphor-containing member 30A according to this modification includes a plurality of layers each including a transparent material.

More specifically, in the phosphor optical element 1A according to this modification, the phosphor-containing member 30A includes: two phosphor-containing members, namely, a first phosphor-containing member 30a and a second phosphor-containing member 30b; and a transparent member 35 formed between the first phosphor-containing member 30a and the second phosphor-containing member 30b.

Each of the first phosphor-containing member 30a and the second phosphor-containing member 30b includes, as with the phosphor-containing member 30 in FIG. 1, the transparent member 31 and the phosphor particles 32 included in the transparent member 31. Here, for example, the transparent member 31, which is included in the first phosphor-containing member 30a and the second phosphor-containing member 30b, and the transparent member 35 are formed of transparent materials having different refractive indices. Furthermore, the transparent member 35 is formed only of the transparent material, that is, the phosphor particles are not included.

In this modification as well, each of the phosphor-containing members, namely, the first phosphor-containing member 30a and the second phosphor-containing member 30b is set to have a thickness no greater than wavelengths of the fluorescent light and the incident light, as with Embodiment 1. With this configuration, even in the case where the thickness of each of the phosphor-containing members is increased and an effective amount of the phosphor particles is increased, propagation of fluorescent light in the horizontal direction can be reduced because the thickness of each of the phosphor-containing members is no greater than wavelengths of the fluorescent light and the incident light. Thus, the fluorescent light can have a small light-emitting area.

Note that, although both of the first phosphor-containing member 30a and the second phosphor-containing member 30b include the phosphor particles 32 in this modification, it may be that only one of the first phosphor-containing member 30a and the second phosphor-containing member 30b include the phosphor particles 32.

The phosphor optical element and the light-emitting device according to Embodiment 1 have been thus far described. However, the present disclosure is not limited to the above-described embodiments or modifications.

For example, in the light-emitting device 99 according to this embodiment shown in FIG. 4, a semiconductor laser is used as the light-emitting element 50. However, a super luminescent diode may be used as a light-emitting element of an end-face emission type in which an optical waveguide is formed. Furthermore, although a semiconductor laser, which is the excitation light source, having an emission wavelength of 405 nm is described, a semiconductor laser which emits the light having a wavelength, for example, from 420 nm to 490 nm may be used.

Furthermore, the phosphor particle 32 of the phosphor-containing member 30 in the phosphor optical element 1 according to this embodiment is the InP/ZnS core shell quantum dot phosphor, but is not limited thereto. As the material of the quantum dot phosphor, for example, at least one selected from InN, InP, InAs, InSb, GaN, GaP, GaAs, GaSb, AlN, AlP, AlAs, AlSb, and BN that are Group II-V compound semiconductors, at least one selected from HgS, HgSe, HgTe, CdS, CdSe, CdTe, ZnS, ZnSe, and ZnTe that are Group II-VI compound semiconductors, or at least one selected from the group consisting of mixed crystal of the above can be used.

Furthermore, although the phosphor particle 32 in this embodiment is a nondoped quantum dot phosphor, a doped quantum dot phosphor may be used. As the material included in the doped quantum dot phosphor, for example, at least one from $ZnS:Mn^{2+}$, $CdS:Mn^{2+}$, and $YVO_4:Eu^{3+}$ can be used. Furthermore, in is a broader sense, it is sufficient that the phosphor particle 32 be a phosphor particle which (i) has a size no greater than the wavelength of the fluorescent light and, (ii) is a phosphor particle having a reduced non-light emission recombination loss caused by surface flaws. For example, YAG:Ce nanoparticles may be used.

Furthermore, a resin material of the transparent member 31 in this embodiment is a silicone resin, but is not limited thereto. As a resin material of the transparent member 31, other than the silicone resin, a transparent resin material such as an acrylic resin, an epoxy resin, or the like can be used. Furthermore, the transparent member 31 need not include a resin material and, for example, may include an inorganic transparent material, such as low melting point glass. In this case, the phosphor-containing member 30 can be configured by mixing into the inorganic transparent material the phosphor particle 32 having a particle diameter no greater than the wavelength of fluorescent light.

Furthermore, the first base layer 21, the second base layer 22, the first cover layer 41, and the second cover layer 42 in this embodiment are a multilayer film including a combination of ZnO, $TiO_2$, and $SiO_2$, but are not limited thereto. For example, the base member 20 and the cover member 40 may be a dielectric multilayer film including a low refractive index material and a high refractive index material. As the material having a low refractive index, for example, one of $Bi_2O_3$, $Ta_2O_5$, $La_2O_3$, $Al_2O_3$, $SiO_x$ ($x \leq 1$), $LaF_3$, a complex oxide of $La_2O_3$ and $Al_2O_3$, and a complex oxide of $Pr_2O_3$ and $Al_2O_3$, or an complex oxide of at least two materials selected from the above, or a dielectric material such as a fluoride or the like, such as $CaF_2$, $MgF_2$, or LiF can be used. Furthermore, as a material having a high refractive index, for example, (i) one of $TiO_2$, $Nb_2O_5$, and $Ta_2O_5$ or (ii) a complex oxide or the like including as a main component one of $TiO_2$, $Nb_2O_5$, and $Ta_2O_5$ can be used.

Embodiment 2

Figure 6A:
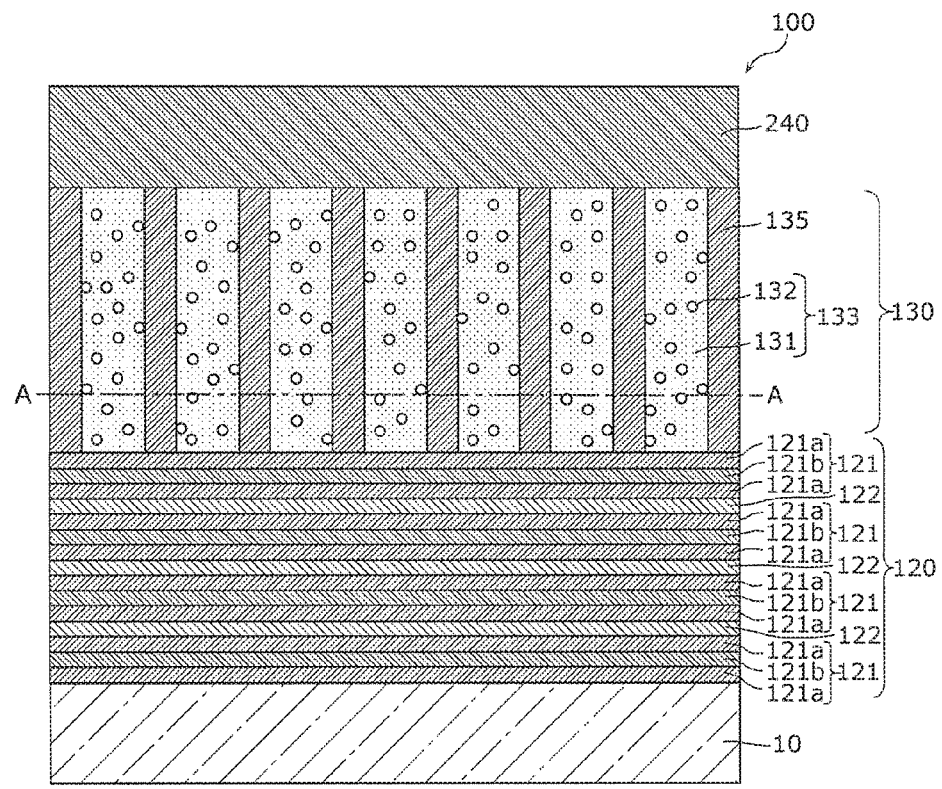
FIG. 6A is a cross-sectional view showing a configuration of a phosphor optical element according to Embodiment 2.
Figure 6B:
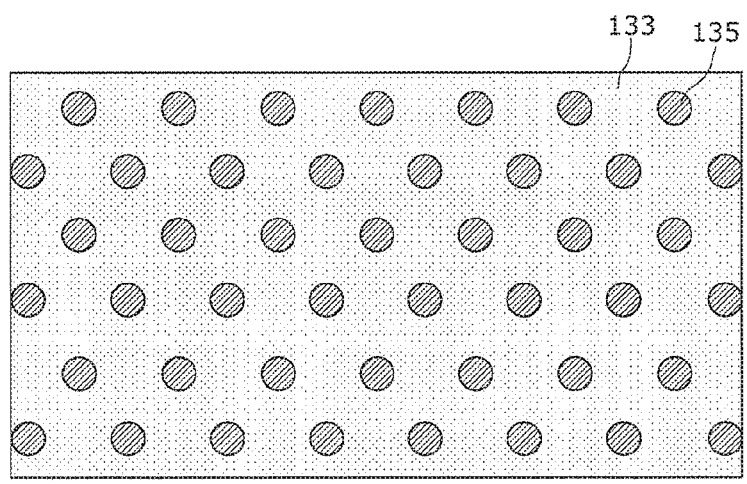
FIG. 6B is a cross-sectional view showing a configuration of the phosphor optical element according to Embodiment 2, taken along a line A-A of FIG. 6A.

Next, a phosphor optical element according to Embodiment 2 of the present disclosure is described using FIG. 6A and FIG. 6B. FIG. 6A is a cross-sectional view showing a configuration of a phosphor optical element according to this embodiment. FIG. 6B is a cross-sectional view showing a configuration of the phosphor optical element according to this embodiment, taken along a line A-A of FIG. 6A. Note that, in FIG. 6A, the same structural elements as those in FIG. 1 are denoted with the same reference signs, and their descriptions are omitted or simplified.

As shown in FIG. 6A and FIG. 6B, the phosphor optical element 100 according to this embodiment is a light-emitting element that emits fluorescent light with incident light from an excitation light source, and includes: a transparent base 10 which includes, for example, glass, a transparent resin film, or the like; and a stacked structure which includes a base member 120, a phosphor-containing layer 130 and a cover member 240 which are sequentially formed on the transparent base 10.

The base member 120 is a dielectric multilayer film which is formed of a first base layer 121 in which, for example, a second refractive index layer 121b including $TiO_2$ is between first refractive index layers 121a including ZnO; and a second base layer 122 that includes, for example, $SiO_2$. The layers are stacked in a direction perpendicular to a main surface (the surface) of the transparent base 10. The base member 120 includes the first base layer 121 and the second base layer 122 that are alternately stacked, and is a multilayer film in which, for example, five or more layers made up of the first base layers 121 and the second base layers 122 are stacked. The base member 120 in this embodiment includes seven layers, that is, four layers of the first base layer 121 and three layers of the second base layer 122. Note that, each of the bottommost layer and the topmost layer of the base member 120 is the first base layer 121 that is the ZnO film.

Furthermore, the base member 120 is transparent to a wavelength of incident light (excitation light) from the excitation light source, and acts as a mirror to a wavelength of the fluorescent light emitted from the phosphor-containing layer 130. More specifically, the base member 120 functions as a first dichroic mirror which transmits the excitation light, and reflects the fluorescent light from the phosphor-containing layer 130.

The phosphor-containing layer 130 is formed on the base member 120, and includes a phosphor-containing member 133 and a transparent member 135. The phosphor-containing member 133 includes: a transparent member 131 which includes a transparent material; and phosphor particles 132 which are included in the transparent member 131 and emit fluorescent light with incident light (excitation light) from the excitation light source. Each of the phosphor particles 132 may be, for example, a semiconductor particle having a particle diameter no greater than 100 nm, such as an InP quantum dot phosphor. The transparent member 131 is a first transparent member, and may include, for example, a transparent material, such as a silicone resin having a refractive index of 1.4.

The transparent member 135 is a second transparent member including a plurality of cylindrical rods each of which includes a transparent material and stand on the base member 120 to have a positional relationship that forms a triangular lattice as shown in FIG. 6B. In this embodiment, the transparent member 135 includes only a transparent material. Furthermore, as shown in the figure, the phosphor-containing member 133 in the phosphor-containing layer 130 is formed to fill the space between the columnar transparent members 135 which are standing. As a transparent material of the transparent member 135, for example, a material having a different refractive index than a transparent material of the transparent member 131 of the phosphor-containing member 133 may be used. For example, ZnO having a refractive index of 2.0 may be used.

In this manner, the phosphor-containing layer 130 in this embodiment includes the phosphor-containing member 133 and the transparent member 135 which are alternately arranged in a two dimensional planar direction that is a direction parallel to the main surface of the transparent base 10, and is configured to have a refractive index distribution according to a two-dimensional periodic structure. Such a two-dimensional periodic structure can also be configured with, for example, a photonic crystal that is a nanostructure having a refractive index that changes periodically.

The cover member 240 is a transparent board including a transparent material such as glass or the like, and is formed on the phosphor-containing layer 130. The cover member 240 according to this embodiment is a single glass board.

In the phosphor optical element 100 having the above-described configuration, the phosphor particle 132 in the phosphor-containing member 133 is configured to have a particle diameter no greater than a wavelength of the incident light from the excitation light source. Furthermore, in the arbitrary cross section of the phosphor-containing layer 130 in the direction perpendicular to the main surface of the transparent base 10, the thickness of the phosphor-containing member 133 in a direction horizontal to the main surface of the transparent base 10, that is, a thickness of the phosphor-containing layer 130 in the horizontal direction excluding the thickness of the transparent member 135 is also configured to be no greater than the wavelength of the incident light from the excitation light source.

With this configuration, for example, the phosphor particles 132 of the phosphor-containing member 133 perform long wavelength conversion on the excitation light (incident light) having a wavelength of 450 nm, and emit, for example, fluorescent light having a peak wavelength of 540 nm. In this case, the thickness of the phosphor-containing member 133 in the above-described cross-section that is a pitch of the transparent members 135 formed to be a triangular lattice is no greater than 450 nm that is the wavelength of the excitation light. More specifically, the thickness of the phosphor-containing member 133 in the above-described cross-section is set to, for example, no greater than 380 nm that is the resulting wavelength by dividing the peak wavelength (540 nm) of fluorescent light by the refractive index (1.4) of the transparent member 131.

Figure 7:
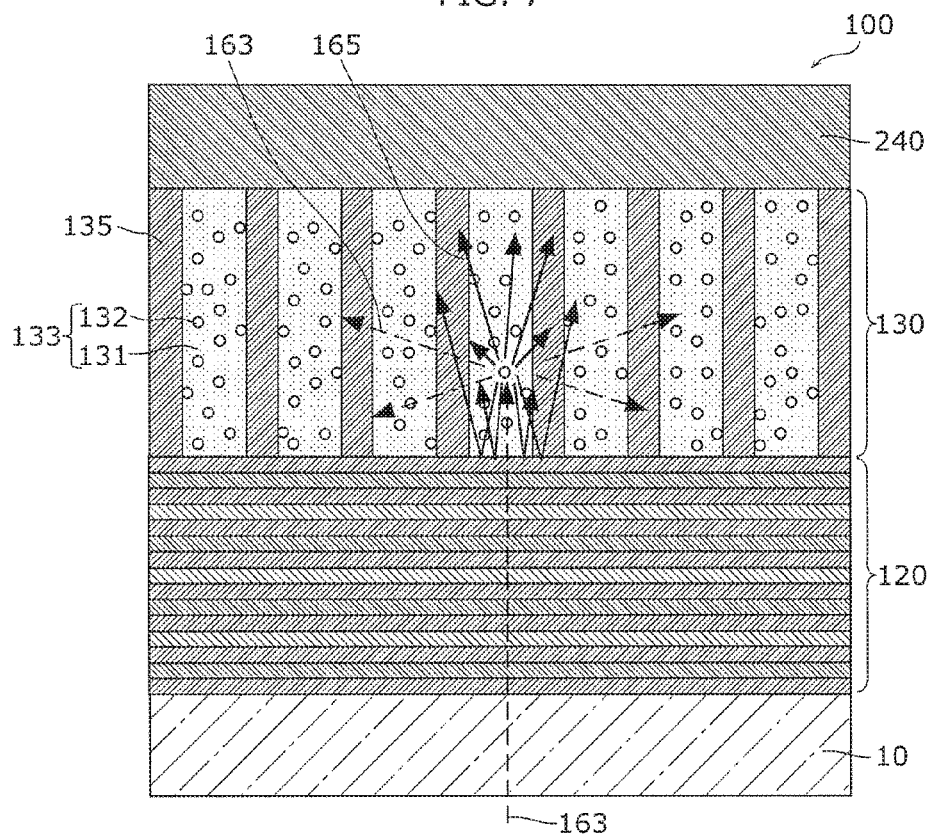
FIG. 7 is a diagram for describing operations of the phosphor optical element according to Embodiment 2.

Next, operations of the phosphor optical element 100 according to this embodiment having the above-described configuration are described using FIG. 7. FIG. 7 is a diagram for describing operations of a phosphor optical element according to this embodiment.

As shown in FIG. 7, incident light 163 which is from the excitation light source and enters from the transparent base 10 side passes through the transparent base 10 and the base member 120, and enters the phosphor-containing layer 130. A portion of the incident light 163 which entered the phosphor-containing layer 130 is converted into fluorescent light 165 by the phosphor particles 132, and another portion of the incident light 163 not absorbed by the phosphor particles 132 passes through the phosphor-containing layer 130. A portion of the incident light 163 which passed through the phosphor-containing layer 130 is reflected by the cover member 240, and then enters the phosphor-containing layer 130 again. A portion of the light which entered the phosphor-containing layer 130 again is converted into fluorescent light 165 by the phosphor particles 132.

The fluorescent light 165 obtained as a result of the conversion in the phosphor-containing layer 130 or the incident light 163 reflected by the phosphor particles 132 is omnidirectionally emitted. Among this, the fluorescent light 165 which entered the cover member 240 passes through the cover member 240, and is emitted in a predetermined emission direction. On the other hand, the fluorescent light 165 which travels toward the base member 120 is reflected by the base member 120, passes through again the phosphor-containing layer 130 and the cover member 240, and is emitted in a predetermined emission direction.

In this case, as described above, in the phosphor optical element 100 according to this embodiment, to allow the phosphor-containing member 133 to have a thickness no greater than a wavelength of the incident light 163 (excitation light), the phosphor-containing layer 130 has a periodic structure with which the fluorescent light 165 is less likely to propagate in a planar direction. Thus, the fluorescent light 165 scarcely propagates in a planar direction of the phosphor-containing layer 130 that is a two dimensional direction parallel to the main surface of the transparent base 10. Thus, the light-emitting area of the fluorescent light 165 can be about the same size as the area on which the incident light 163 (excitation light) incidents. This makes it possible to easily reduce the light-emitting area of the fluorescent light 165 without reducing the area of the phosphor-containing layer 130. As a result, the traveling direction of light can be freely controlled with an optical system or the like which is disposed in a stage subsequent to the phosphor optical element 100.

Figure 8A:
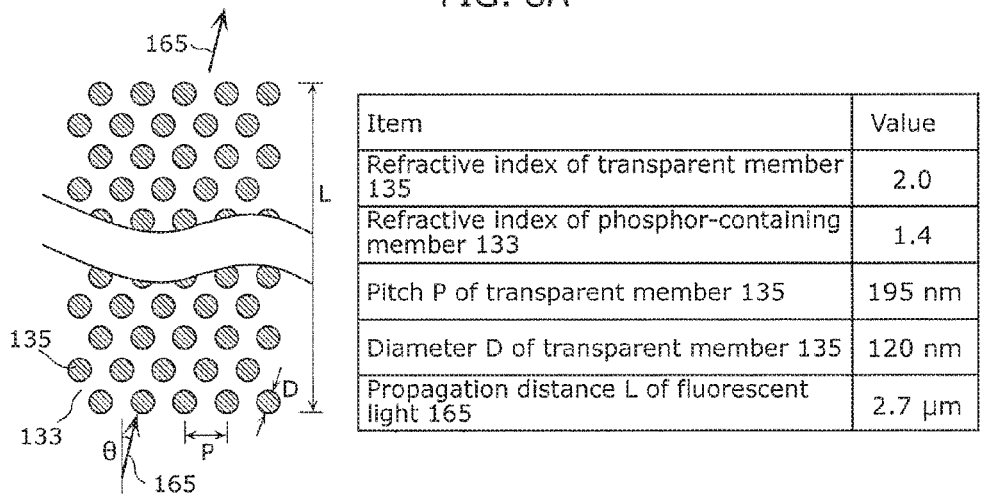
FIG. 8A is a diagram for describing calculation parameters for describing functions of the phosphor optical element according to Embodiment 2.
Figure 8B:
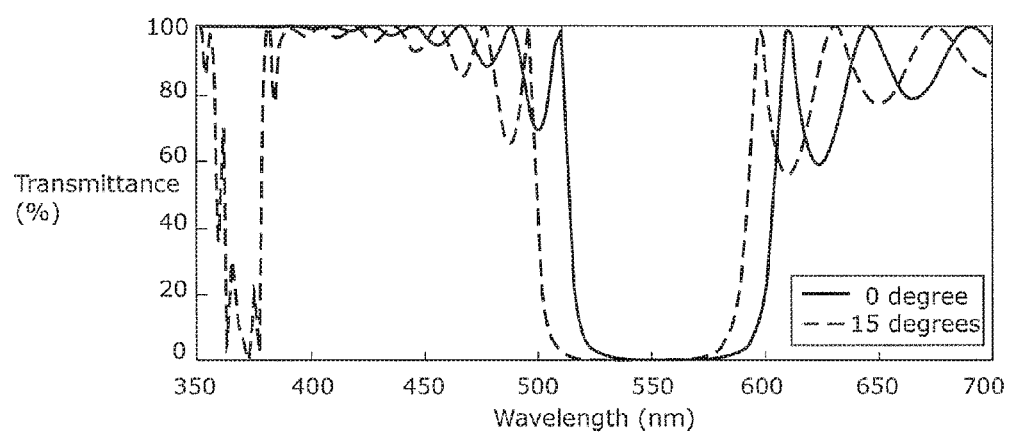
FIG. 8B is a diagram showing transmittance of a phosphor-containing layer in the phosphor optical element according to Embodiment 2, which is calculated based on the calculation parameters in FIG. 8A.
Figure 8C:
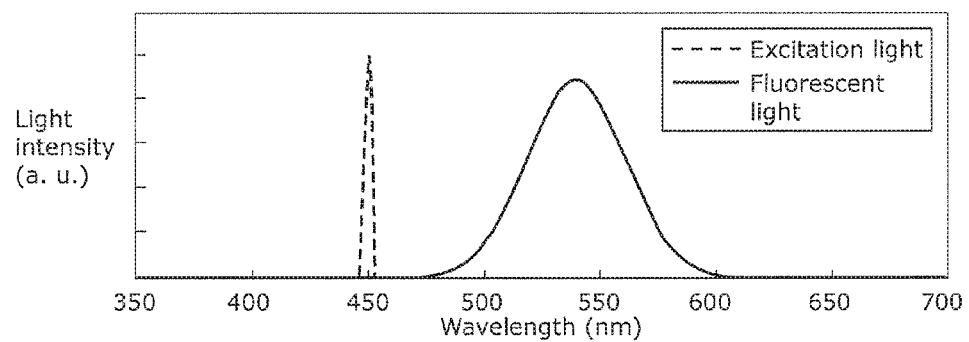
FIG. 8C is a diagram showing light intensity of excitation light and fluorescent light in the phosphor optical element according to Embodiment 2.

Next, operations of the phosphor optical element 100 according to this embodiment in FIG. 7 is described based on the calculation results of FIG. 8A, FIG. 8B, and FIG. 8C. FIG. 8A is a diagram for describing calculation parameters for describing functions of the phosphor optical element according to this embodiment. Specifically, the diagram on the left in FIG. 8A shows the phosphor-containing layer 130 in the cross-sectional direction in a similar manner as FIG. 6B, and defines that the pitch of the transparent member 135 is P, and the diameter is D. Furthermore, it is assumed that the incident light 163 is converted into the fluorescent light 165 at an arbitrary point, and the fluorescent light 165 enters at angle θ the transparent member 135, which is disposed to form a triangular lattice, and propagates a distance L. At this time, the transmittance of the phosphor-containing layer 130 in the phosphor optical element 100 according to this embodiment is shown in FIG. 8B based on the calculation parameters in the diagram on the right in FIG. 8A. Note that, FIG. 8B shows the transmittance in the cases where the angles θ are 0 degree and 15 degrees. Furthermore, FIG. 8C is a diagram showing spectrums of the incident light 163 and the fluorescent light 165 for describing effects of characteristics of the transmittance of the phosphor-containing layer 130.

Here, the excitation light (the incident light 163) has a wavelength of 450 nm, and the excitation light in this embodiment is laser light. It is assumed that the fluorescent light 165 has a peak wavelength of 540 nm, and is the light from the phosphor particles 132 including quantum dot phosphors.

As shown in FIG. 8B, according to the transmittance of the phosphor-containing layer 130 obtained using the calculation parameters in FIG. 8A, the phosphor-containing layer 130 scarcely propagates, in the planar direction, light having a wavelength from 520 nm to 580 nm in a range within a propagation distance of 3 μm. Such light is not absorbed by the phosphor-containing layer 130, cannot propagate toward the base member 120, and thus travels toward the above of the phosphor optical element 100, that is, toward the cover member 240. In this manner, it is possible to emit the fluorescent light 165 in an identical direction from the phosphor optical element 100, without increasing the light-emitting area of the fluorescent light 165. In other words, the light-emitting area of the fluorescent light 165 can be reduced without reducing the area of the phosphor-containing member 30.

Note that, the incident light 163 having the wavelength of 450 nm is scattered by the phosphor particles 132 and propagates in a lateral direction. However, the laterally propagated light is absorbed by the phosphor particles 132 in the vicinity of incident position and converted into fluorescent. Thus, the light-emitting area does not increase.

Figure 9:
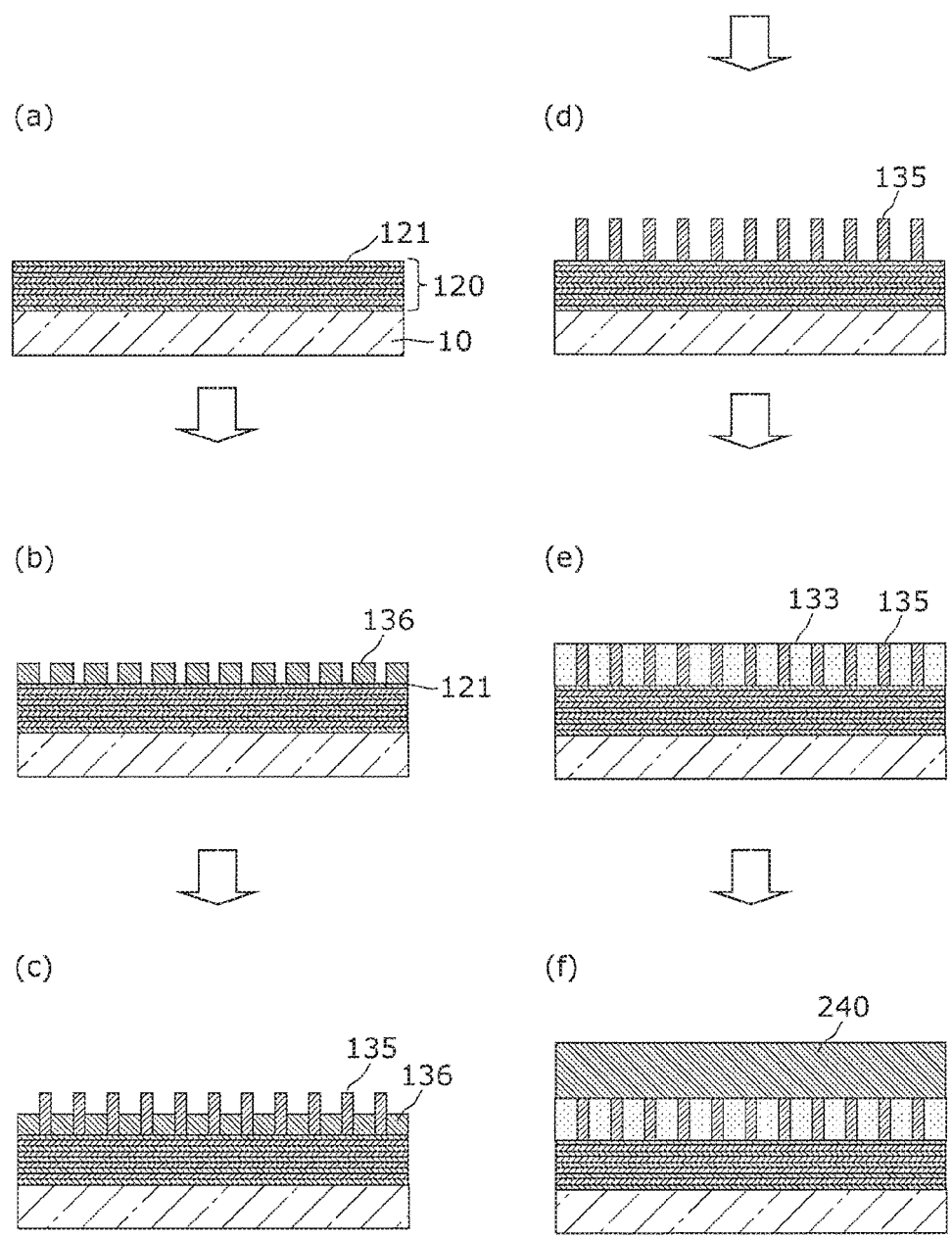
FIG. 9 shows cross-sectional views for describing processes in a method of manufacturing the phosphor optical element according to Embodiment 2.

Next, a method of manufacturing the phosphor optical element 100 according to this embodiment is described using FIG. 9. FIG. 9 is a cross-sectional view for describing processes in a method of manufacturing a phosphor optical element according to this embodiment.

First, as shown in (a) in FIG. 9, for example, on the transparent base 10 which includes a transparent base such as glass, a transparent resin film, or the like, the base member 120 is formed by alternately stacking (i) the first base layer 121 that includes a film composed of a TiO₂ layer and ZnO layers sandwiching the TiO₂ layer, for example, and (ii) the second base layer 122 that includes SiO₂ for example, until, for example, nine layers are stacked. At this time, formation is performed to have the first base layer 121 including ZnO to be the topmost surface of the base member 120.

Subsequently, as shown in (b) in FIG. 9, on the base member 120 (the first base layer 121), resist 136 is formed which is patterned to correspond to the arrangement of the triangular lattice of the transparent members 135 of the phosphor-containing layer 130. Note that, in this embodiment, the resist 136 includes a plurality of openings each of which is circular in the planar view.

Subsequently, the transparent base 10 including the resist 136 formed on the base member 120 is immersed approximately for five hours in a solution which is for forming a film of zinc oxide crystal and includes zinc nitrate hexahydrate and hexamethylene tetramine heated to 70 degrees Celsius. With this, the columnar transparent member 135 including ZnO is formed as shown in (c) in FIG. 9.

More specifically, 0.1M zinc nitrate hexahydrate (manufactured by Wako Pure Chemical Industries, Ltd., Wako special grade) and 0.1M hexamethylene tetramine (manufactured by Wako Pure Chemical Industries, Ltd., special grade reagent) are dissolved in pure water and adjusted to prepare solution for forming a film of zinc oxide crystal. The solution temperature of the adjusted solution is set to 70 degrees Celsius, and the above-described transparent base 10 is immersed in the solution. With this, for example, ZnO crystal of 500 nm grows on the base member 120 (the first base layer 121) exposed in the opening of the patterned resist 136. After this, the transparent base 10 is removed from the solution, cleaned with pure water, and dried.

Next, as shown in (d) in FIG. 9, the resist 136 is removed. With this, the transparent members 135 that are cylindrical standing pillars forming a triangular lattice are formed on the base member 120.

Next, as shown in (e) in FIG. 9, from above the transparent members 135 that are arranged in a triangular lattice, a phosphor-containing resin material is dropped which is obtained by adding the phosphor particles 132 that are, for example, InP/ZnS core shell quantum dot phosphors to the transparent member 131 including, for example, a silicone resin. After this, the above is kept in a vacuum. With this, the phosphor-containing resin material including the phosphor particles 132 is filled in a space between the transparent members 135.

Next, as shown in (f) in FIG. 9, the cover member 240, which includes glass for example, is pressed by applying pressure from above the transparent member 135. With this, it is possible to form the phosphor-containing layer 130 which includes: the phosphor-containing member 133 including the transparent member 131 that includes the phosphor particles 132; and the transparent member 135. In this manner, the phosphor optical element 100 according to this embodiment can be easily manufactured.

Figure 10:
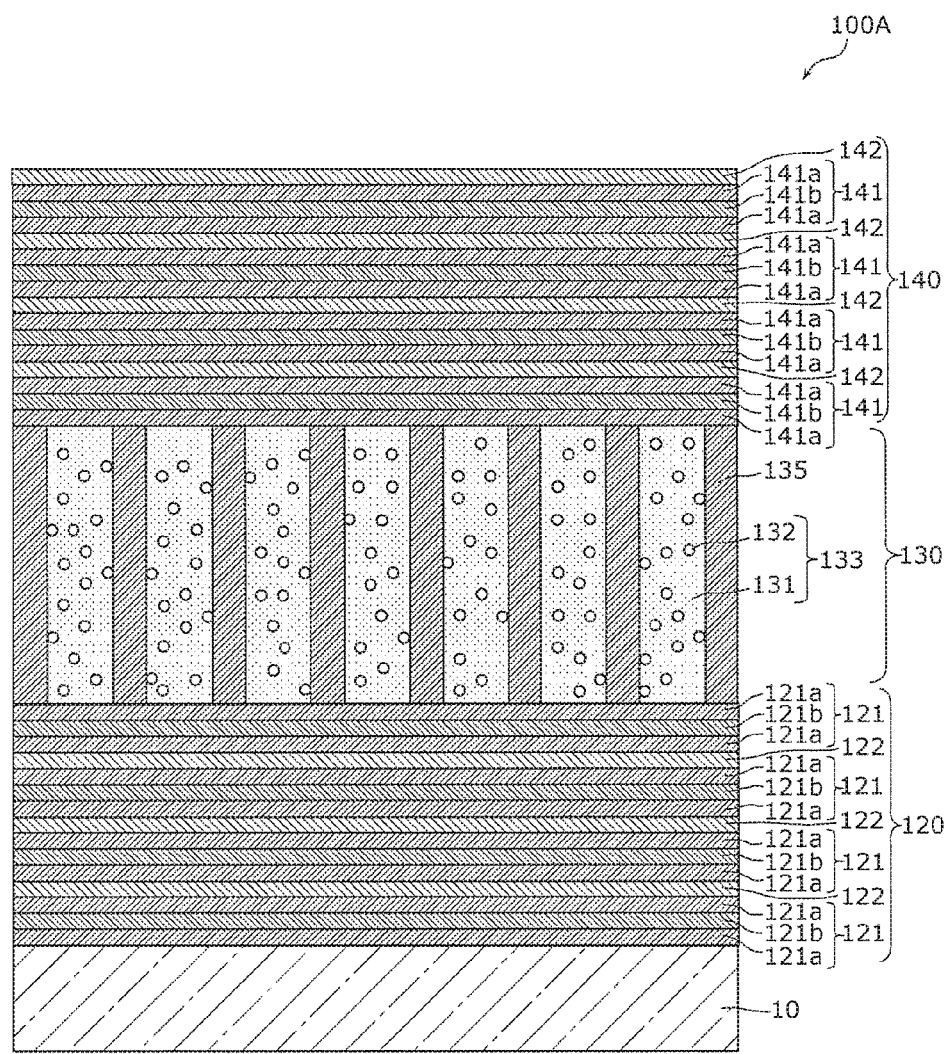
FIG. 10 is a cross-sectional view showing a configuration of a phosphor optical element according to Modification 1 of Embodiment 2.

Next, a phosphor optical element 100A according to Modification 1 of Embodiment 2 of the present disclosure is described using FIG. 10. FIG. 10 is a cross-sectional view showing a configuration of a phosphor optical element according to Modification 1 of Embodiment 2 of the present disclosure. Note that, a configuration of the phosphor optical element 100A according to this modification is substantially the same as the configuration of the phosphor optical element 100 according to Embodiment 2. Thus, this modification mainly describes portions that are different from Embodiment 2. Note that, in FIG. 10, the same structural elements as those in FIG. 6A are denoted with the same reference signs.

As shown in FIG. 10, the phosphor optical element 100A according to this modification is different in a configuration of a cover member when compared with the phosphor optical element 100 according to Embodiment 2 shown in FIG. 6A.

More specifically, a cover member 140 in this modification is a dielectric multilayer film which includes (i) a first cover layer 141 including, for example, ZnO/TiO₂/ZnO, that is, for example, a fourth refractive index layer 141b including TiO₂ is between third refractive index layers 141a including ZnO, and (ii) a second cover layer 142 that includes, for example, SiO₂. Note that, the first cover layer 141 and the second cover layer 142 are alternately stacked in a direction perpendicular to the main surface of the transparent base 10.

Furthermore, in contrast to the base member 120, the cover member 140 acts as a mirror to a wavelength of the incident light (excitation light) from the excitation light source, and is transparent to a wavelength of the fluorescent light emitted from the phosphor-containing layer 130. More specifically, the cover member 140 functions as a second dichroic mirror which reflects the excitation light and transmits the fluorescent light from the phosphor-containing layer 130.

With the phosphor optical element 100A according to this modification, the advantageous effect due to the two-dimensional periodic structure of the phosphor-containing layer 130 is produced, and an advantageous effect of holding the phosphor-containing layer 130 between dichroic mirrors of the base member 120 including a dielectric multilayer film and the cover member 140 is produced as described in Embodiment 1. More specifically, compared to the phosphor optical element 100 according to Embodiment 2, the phosphor optical element 100A according to this modification can (i) efficiently generate fluorescent light in the phosphor-containing layer 130 because the incident light passes through the base member 120 and is reflected by the cover member 140, and (ii) efficiently emit the generated fluorescent light to outside of the phosphor optical element 100A because the fluorescent light generated in the phosphor-containing layer 130 passes through the cover member 140 and is reflected by the base member 120.

Figure 11:
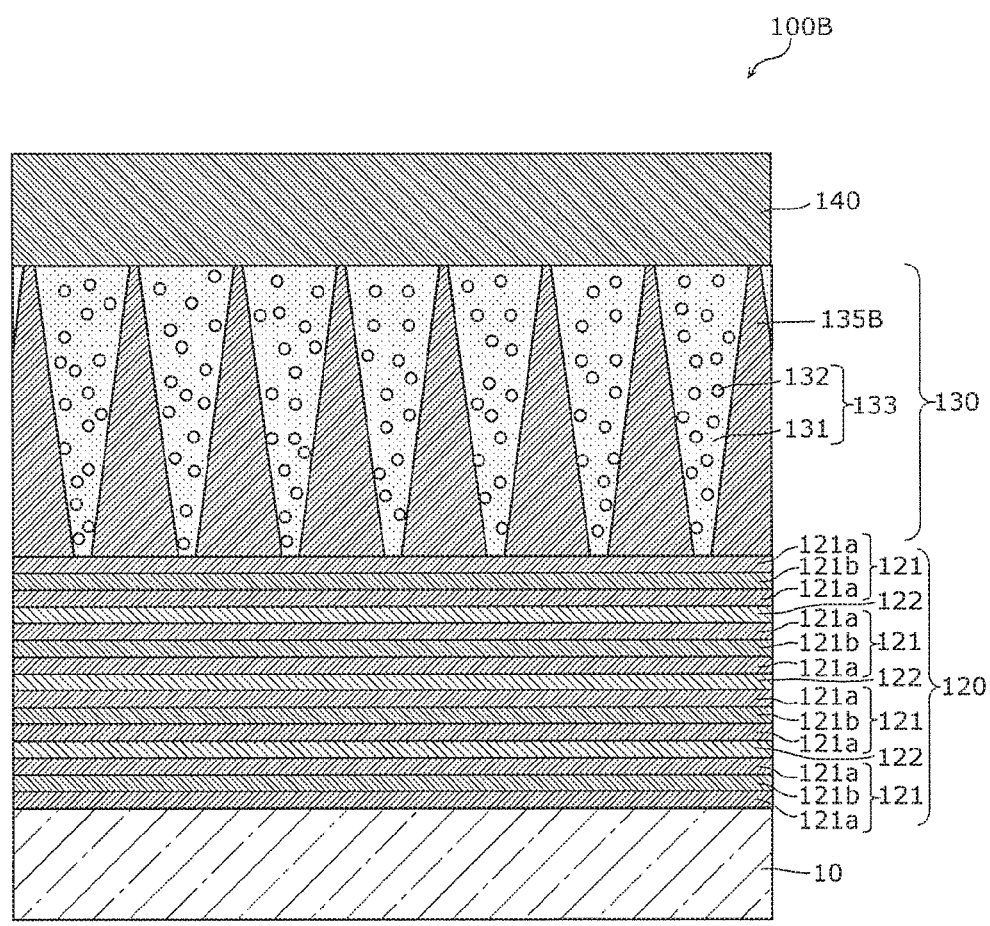
FIG. 11 is a cross-sectional view showing a configuration of a phosphor optical element according to Modification 2 of Embodiment 2.

Next, a phosphor optical element 100B according to Modification 2 of Embodiment 2 of the present disclosure is described using FIG. 11. FIG. 11 is a cross-sectional view showing a configuration of a phosphor optical element according to Modification 2 of Embodiment 2 of the present disclosure. Note that, the phosphor optical element 100B according to this modification has a configuration substantially the same as the configuration of the phosphor optical element 100 according to Embodiment 2. Thus, this modification mainly describes portions which are different from Embodiment 2. Note that, in FIG. 11, the same structural elements as those in FIG. 6A are denoted with the same reference signs.

As shown in FIG. 11, compared to the phosphor optical element 100 according to Embodiment 2 shown in FIG. 6A, the phosphor optical element 100B according to this modification is different in the configuration of the columnar transparent member.

Specifically, a transparent member 135B according to this modification is configured to have a conic trapezoidal shape so as to have a tapered structure in which the area of the cross-section gradually decreases from the transparent base 10 side (the base member 120 side) toward the surface side (the cover member 140 side) that is the light emission side.

With this configuration, in the phosphor optical element 100B according to this modification, the ratio of the phosphor-containing member 133 to the phosphor-containing layer 130 can be changed in a traveling direction of the incident light. With this, the fluorescent light conversion efficiency in the phosphor particles 132 can be improved, and the fluorescent light emitted from the phosphor particles 132 can be reflected by the side surface of the transparent member 135B and guided to the emission side of the phosphor optical element 1005. Thus, the fluorescent light generated in the phosphor-containing layer 130 can be efficiently emitted to the outside of the phosphor optical element 100B.

Figure 12A:
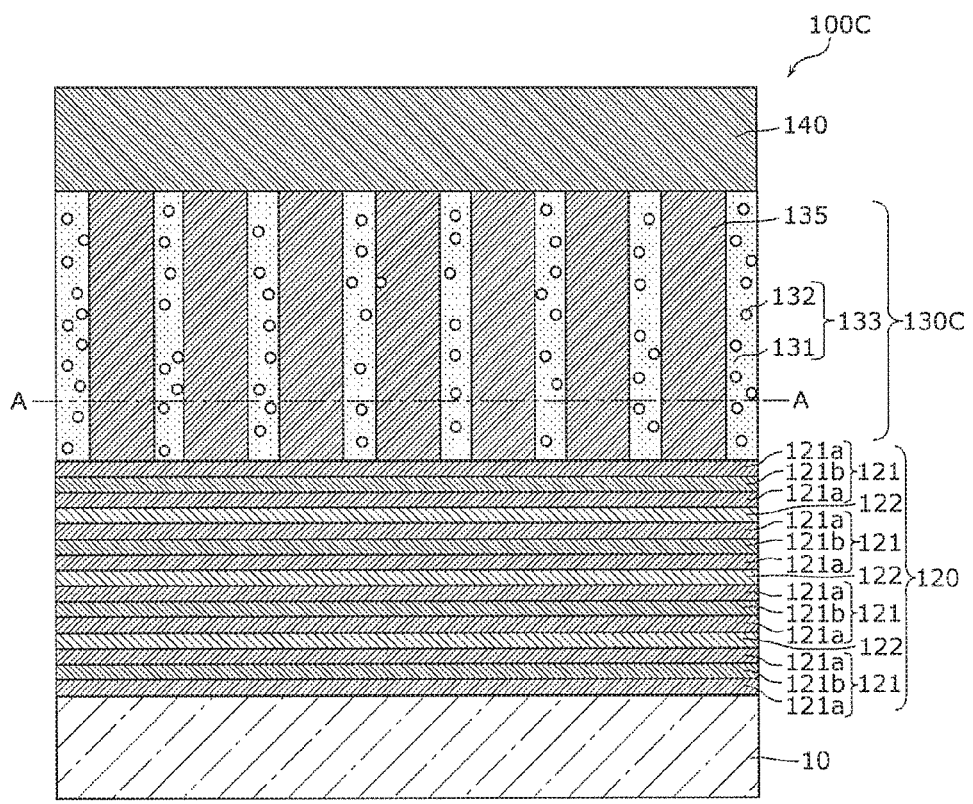
FIG. 12A is a cross-sectional view showing a configuration of a phosphor optical element according to Modification 3 of Embodiment 2
Figure 12B:
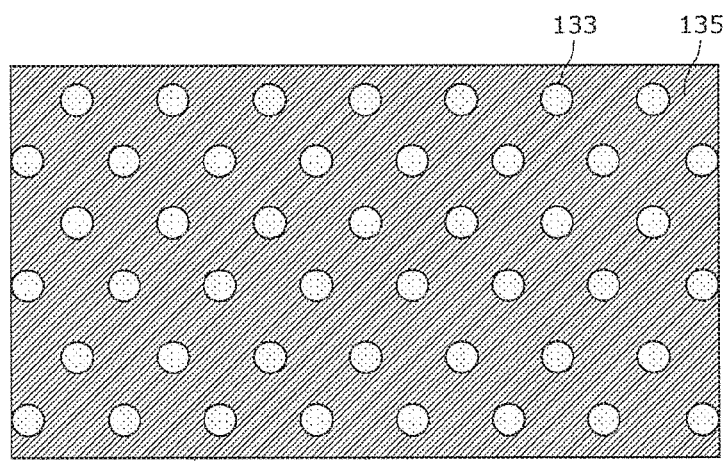
FIG. 12B is a cross-sectional view showing a configuration of the phosphor optical element according to Modification 3 of Embodiment 2, taken along a line A-A of FIG. 12A.

Next, a phosphor optical element 100C according to Modification 3 of Embodiment 2 of the present disclosure is described using FIG. 12A and FIG. 12B. FIG. 12A is a cross-sectional view showing a configuration of a phosphor optical element according to Modification 3 of Embodiment 2 of the present disclosure. FIG. 12B is a cross-sectional view showing a configuration of the phosphor optical element according to Modification 3 of Embodiment 2 of the present disclosure, taken along a line A-A of FIG. 12A. Note that, in FIG. 12A and FIG. 12B, the same structural elements as those in FIG. 6A and FIG. 6B are denoted by the same reference signs.

As shown in FIG. 12A and FIG. 12B, a phosphor optical element 100C according to this modification has a configuration obtained by swapping the phosphor-containing member 133 and the transparent member 135 in the phosphor-containing layer 130 in the phosphor optical element 100 shown in FIG. 6A and FIG. 6B.

More specifically, in a phosphor-containing layer 130C in this modification, each of the phosphor-containing members 133 is a cylindrical rod, and is disposed to form a triangular lattice. Furthermore, the transparent member 135 is formed to fill the space between the phosphor-containing members 133.

With the configuration of the phosphor optical element 100C according to this modification as well, a similar advantageous effect can be produced as the phosphor optical element 100 according to Embodiment 2. More specifically, configurations of the phosphor-containing member 133 and the transparent member 135 can be freely changed according to the design of the two-dimensional periodic structure.

Figure 13:
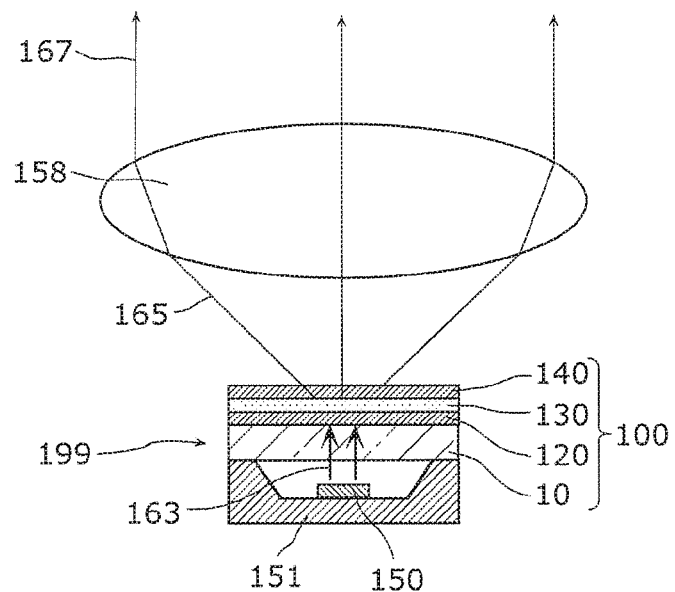
FIG. 13 is a diagram for describing a configuration and operations of a light-emitting device using the phosphor optical element according to Embodiment 2.
Figure 14:
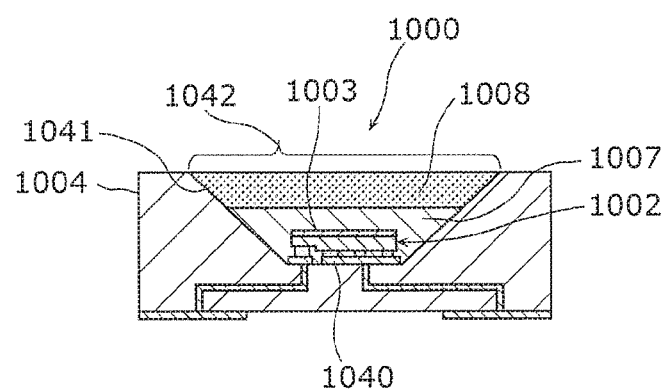
FIG. 14 is a cross-sectional view showing a configuration of a light-emitting device according to a conventional example.

Subsequently, a configuration and operations of a light-emitting device 199 using a phosphor optical element according to this embodiment is described using FIG. 13. FIG. 13 is a diagram for describing a configuration and operations of a light-emitting device using the phosphor optical element according to Embodiment 2 of the present disclosure.

As shown in FIG. 13, the light-emitting device 199 according to this embodiment includes a package 151 including a recess, a light-emitting element 150 mounted on the base of the recess, and the phosphor optical element 100 formed above the package 151. The optical axis of the light-emitting element 150 is perpendicular to the surface of the transparent base 10 of the phosphor optical element 100. The following describes structural elements of the light-emitting device 199.

The package 151 includes, for example, a white resin, and an inner surface of the recess is a reflecting surface tilted to reflect the light emitted by the light-emitting element 150 toward the light extraction direction (the phosphor optical element 100 side). Note that, the inside of the recess of the package 151 may be filled with a transparent resin in which diffusing materials are dispersed.

The light-emitting element 150 is the excitation light source for the phosphor optical element 100, and is a semiconductor light-emitting element, such as a light-emitting diode (LED) which emits, for example, ultraviolet light to blue light having an emission wavelength of 350 nm to 500 nm. The light-emitting element 150 in this embodiment uses an LED chip having an emission wavelength of 450 nm. Note that, the light-emitting element 150 mounted on the base of the recess of the package 151 is electrically connected to a lead frame (not shown) embedded in the base of the recess of the package 151.

The phosphor optical element 100 is disposed on the upper surface of the package 151 with a predetermined distance from the light-emitting element 150. In this embodiment, the phosphor optical element 100 is formed to cover the opening of the recess of the package 151. Note that, a collimating lens 158 is disposed on the light emission side of the light-emitting device 199.

With the light-emitting device 199 having the above-described configuration, the incident light 163 (excitation light) emitted from the light-emitting element 150 enters the phosphor optical element 100, and is converted into the fluorescent light 165. The fluorescent light 165 is emitted from the phosphor optical element 100 with a light distribution angle narrower than the incident light 163 of a predetermined Lambertian distribution emitted from the light-emitting element 150, and is converted into parallel light 167 by the collimating lens 158. At this time, the fluorescent light 165 is emitted from a small light-emitting area about the same size as the light-emitting element 150. Thus, good parallel light having a small oblique light component can be obtained with the collimating lens 158.

Although the phosphor optical element and the light-emitting device according to Embodiment 2 have been described thus far, the present disclosure is not limited to the above-described embodiments or modifications.

For example, although a light-emitting diode is used as the light-emitting element 150 in the light-emitting device 199 according to this embodiment, a semiconductor laser or a super luminescent diode each of which is a light-emitting element of an end-face emission type in which an optical waveguide is formed may be used. In this case, the emission light of the light-emitting element is emitted parallel to the base of the recess. Thus, for example, the emitted light may be guided in a perpendicular direction using the tilted side face of the package. Furthermore, although the light-emitting element 150 has the emission wavelength of 450 nm, a semiconductor laser or the like which emits light having a wavelength from 380 nm to 440 nm may be used, for example.

Furthermore, the phosphor particle 132 of the phosphor-containing member 133 in the phosphor optical elements 100, 100A, 100B, and 100C according to this embodiment is the InP/ZnS core shell quantum dot phosphor, but is not limited thereto. As the material of the quantum dot phosphor, for example, at least one selected from InN, InP, InAs, InSb, GaN, GaP, GaAs, GaSb, AlN, AlP, AlAs, AlSb, and BN that are Group II-V compound semiconductors, at least one selected from HgS, HgSe, HgTe, CdS, CdSe, CdTe, ZnS, ZnSe, and ZnTe that are Group II-VI compound semiconductors, or at least one selected from the group consisting of mixed crystal of the above can be used.

Furthermore, although the phosphor particle 132 in this embodiment is a nondoped quantum dot phosphor, a doped quantum dot phosphor may be used. As the material included in the doped quantum dot phosphor, for example, at least one from $ZnS:Mn^{2+}$, $CdS:Mn^{2+}$, and $YVO_4:Eu^{3+}$ can be used. Furthermore, in a broader sense, it is sufficient that the phosphor particle 132 be a phosphor particle which (i) has a size no greater than the wavelength of the fluorescent light and, (ii) is a phosphor particle having a reduced non-light emission recombination loss caused by surface flaws. For example, YAG:Ce nanoparticles may be used.

Furthermore, the resin material of the transparent member 131 in this embodiment is a silicone resin, but is not limited thereto. As the resin material of the transparent member 131, other that the silicone resin, a transparent resin material, such as an acrylic resin or an epoxy resin, can be used. Furthermore, the transparent member 131 need not include a resin material, and may include, for example, an inorganic transparent material, such as low melting point glass. In this case, the phosphor-containing member 133 may be configured by mixing the phosphor particle 132 having a size no greater than a wavelength of the fluorescent light into the inorganic transparent material.

Furthermore, the first base layer 121, the second base layer 122, the first cover layer 141, and the second cover layer 142 in this embodiment is a multilayer film including a combination of $TiO_2$, ZnO, and $SiO_2$, but is not limited thereto. For example, the base member 120 and the cover member 140 may be a dielectric multilayer film including a low refractive index material and a high refractive index material. As the material having a low refractive index, for example, one of $Bi_2O_3$, $Ta_2O_5$, $La_2O_3$, $Al_2O_3$, $SiO_x$ ($x \leq 1$), $LaF_3$, a complex oxide of $La_2O_3$ and $Al_2O_3$, and a complex oxide of $Pr_2O_3$ and $Al_2O_3$, or an complex oxide of at least two materials selected from the above, or a dielectric material such as a fluoride or the like, such as $CaF_2$, $MgF_2$, or LiF can be used. Furthermore, as a material having a high refractive index, for example, (i) one of $TiO_2$, $Nb_2O_5$, and $Ta_2O_5$ or (ii) a complex oxide or the like including as a main component one of $TiO_2$, $Nb_2O_5$, and $Ta_2O_5$ can be used.

Although the phosphor optical element and the light-emitting device according to the present disclosure have been thus far described based on the embodiments and modifications, the present disclosure is not limited to the above-described embodiments and modifications. Various modifications that may be conceived by those skilled in the art which do not depart from the essence of the present disclosure are intended to be included within the scope of the present disclosure. Furthermore, respective structural elements of different embodiments may be arbitrarily combined within the scope of the essence of the present disclosure.

INDUSTRIAL APPLICABILITY

A phosphor optical element and a light-emitting device according to the present disclosure is useful as a light source of backlight in a liquid crystal television, a liquid crystal monitor, or the like or a light source of a projection-type display, such as a projector.

The invention claimed is:

1. A phosphor optical element, comprising:
   a base member; and
   a phosphor-containing layer,
   wherein the base member and the phosphor-containing layer are sequentially formed on a base,
   a topmost layer of the base member is a ZnO layer,
   the phosphor-containing layer includes a plurality of first transparent members containing fine phosphor particles and a second transparent member including ZnO,
   the second transparent member fills in a space between the plurality of first transparent members, and
   the second transparent member is in contact with the topmost layer of the base member.

2. The phosphor optical element according to claim 1, wherein the plurality of first transparent members are surrounded by the second transparent member.

3. The phosphor optical element according to claim 1, wherein the ZnO in the second transparent member is ZnO crystal.

4. The phosphor optical element according to claim 1, wherein a ZnO layer covers a top surface of the phosphor-containing layer.

5. The phosphor optical element according to claim 1, wherein the base is transparent with respect to a wavelength of incident light from an excitation light source.

6. A light-emitting device, comprising:
   a light-emitting element that emits excitation light; and
   a phosphor optical element that receives the excitation light,
   wherein the phosphor optical element includes a base member and a phosphor-containing layer sequentially formed on a base,
   a topmost layer of the base member is a ZnO layer, the phosphor-containing layer includes a plurality of first transparent members containing fine phosphor particles and a second transparent member including ZnO,
the second transparent member fills in a space between the plurality of first transparent members, and
the second transparent member s in contact with the topmost layer of the base member.

7. The light-emitting device according to claim 6, wherein the light-emitting element is a semiconductor laser.

8. The light-emitting device according to claim 7, further comprising a collecting lens that focuses the excitation light from the semiconductor laser onto the phosphor-containing layer.

9. The light-emitting device according to claim 6, wherein the plurality of first transparent members are surrounded by the second transparent member.

10. The light-emitting device according to claim 6, wherein the ZnO in the second transparent member is ZnO crystal.

11. The light-emitting device according to claim 6, wherein a ZnO layer covers a top surface of the phosphor-containing layer.

12. The light-emitting device according to claim 6, wherein the base is transparent with respect to a wavelength of incident light from an excitation light source.

* * * * *